(12) United States Patent
Ingalls et al.

(10) Patent No.: US 6,208,501 B1
(45) Date of Patent: Mar. 27, 2001

(54) STANDING AXIAL-LEADED SURFACE MOUNT CAPACITOR

(75) Inventors: Mark W. Ingalls, Erieville, NY (US); Eric D. Arnold, Whittier, CA (US); David A. Bates, Fayetteville; Bruce F. Semans, Erieville, both of NY (US)

(73) Assignee: Dielectric Laboratories, Inc., Cazenovia, NY (US)

( * ) Notice: Subject to any disclaimer, the term of this patent is extended or adjusted under 35 U.S.C. 154(b) by 0 days.

(21) Appl. No.: 09/332,406

(22) Filed: Jun. 14, 1999

(51) Int. Cl.[7] .............................. H01G 4/005; H01G 2/20; H01G 4/248
(52) U.S. Cl. ........................ 361/303; 361/308.1; 361/310; 361/311
(58) Field of Search ............................ 361/301.1, 301.4, 361/303, 305, 306.1–306.3, 307, 308.1–308.2, 309, 310, 311, 312, 313, 320, 321.1–321.5

(56) References Cited

U.S. PATENT DOCUMENTS

| | | | |
|---|---|---|---|
| 3,633,079 | * 1/1972 | Watson | 361/321.6 |
| 3,732,469 | * 5/1973 | Watson | 361/308.1 |
| 4,346,429 | * 8/1982 | DeMatos | 361/310 |
| 4,870,439 | * 9/1989 | Chance et al. | 361/321.5 |
| 6,094,335 | * 7/2000 | Early | 361/303 |

* cited by examiner

Primary Examiner—Kristine Kincaid
Assistant Examiner—Eric Thomas
(74) Attorney, Agent, or Firm—Bernhard P. Molldrem, Jr.

(57) ABSTRACT

A standing axial-leaded surface mount capacitor is formed of a dielectric chip capacitor sandwiched between first and second blocks. The end blocks have profiles to match the profile of said chip capacitor. The end blocks are conductive at least on their outer surfaces and serve as leads to attaching to metallic surface traces of a printed circuit. In one preferred embodiment, the end blocks are ceramic cubes with metallic surfaces on its faces. The metallized cubes give the device rotational symmetry about its long axis, so that the capacitor will have identical performance in any orientation. This feature makes it possible to automatically pick and place the device onto a circuit board. Preferably, the dielectric chip has a square profile of the same dimension as the ceramic cubes. The profile of the cubes and the chip can be 20 to 25 mils to match the width of a typical printed circuit trace. The capacitors can be of any typical value, i.e., between 0.05 and 300 pf.

10 Claims, 1 Drawing Sheet

STANDING AXIAL-LEADED SURFACE MOUNT CAPACITOR

BACKGROUND OF THE INVENTION

This invention relates to capacitors and in particular concerns surface mount capacitors that can be connected directly to printed metallic traces.

Small dielectric chip capacitors are frequently used in microwave and millimeter wave circuits and are also employed as a DC block for passing a signal. There are several simple designs for passing signal from one printed circuit trace to another, but to date, these have been characterized by significant insertion losses at certain frequencies, and have been difficult to attach automatically to a printed circuit board. One approach has been to use a standing dielectric chip with metallized surfaces, with metal leads attached to the respective surfaces. The capacitor has to be held in place while the leads are soldered to the respective traces. Because the leads have a finite inductance, this approach typically has significant signal resonances, especially for frequencies above a few gigahertz. Also, the leads can break or fail. Another approach is a flat horizontal capacitor with the metallization on its lower side having a gap. A device of this type is the Gap-Cap, manufactured by Dielectric Laboratories, Inc. These devices can also create unwanted resonances at frequencies above a few gigahertz. In addition, these capacitors are all quite small, typically about 20 to 25 mils (0.5 to 0.6 millimeters). At these sizes, the capacitors are difficult to handle, and must be installed using a microscope. There is a definite top and bottom, and it is crucial to install them in the proper orientation, to avoid shorting the circuit. Also, in the case of the capacitor, the requirement to attach metal leads can make their manufacturing costs prohibitive.

The small size of the capacitor is necessary to match the metal film traces as nearly as possible. While it is possible to employ wider bonding pads to accommodate capacitors of a larger physical size, the bonding pads also have to be matched to a transmission line, and any change in width from the bond pad to the transmission line can also result in undesirable insertion loss.

OBJECTS AND SUMMARY OF THE INVENTION

Accordingly, it is an object of the present invention to provide a standing ceramic capacitor that avoids the drawbacks of the prior art, and in particular which easily match the size of the transmission line trace of a microwave or millimeter wave printed circuit, and which have a substantially flat, low-loss transmission characteristic.

It is a further object to provide a standing axial-leaded surface mount capacitor that can be placed and soldered in circuit without regard for orientation about its long axis.

It is another object to provide a standing axial-leaded surface mount capacitor that can be fabricated economically and simply.

In accordance with an aspect of the present invention, a standing axial-leaded surface mount capacitor is formed of a dielectric chip having a rectangular profile and with metallized front and back surfaces, and first and second blocks which have profiles to match the profile of said dielectric chip and which are conductive (at least on outer surfaces) to serve as leads to attaching to metallic surface traces of a printed circuit. In one preferred embodiment, the end blocks are ceramic cubes with metallic surfaces on its faces. The metallized cubes give the device rotational symmetry about its long axis, so that the capacitor will have identical performance in any orientation. This feature makes it possible to automatically pick and place the device onto a circuit board. The metal faces can be of Ni—Au or other suitable metallization to permit solder attachment. Preferably, the dielectric chip has a square profile of the same dimension as the ceramic cubes. The profile of the cubes and the chip can be 20 to 25 mils to match the width of a typical printed circuit trace. The capacitors can be of any typical value, i.e., from 0.05 pf to several hundred pf, and favorably between 5 and 50 pf.

The standing axial-leaded surface mount capacitor of this invention can be fabricated by creating dielectric chips of rectangular profile, preferably square, which are provided with metallic front and back faces. End blocks are created with a profile to match the profile of the ceramic chip, and the end blocks are given metallic outer surfaces. In a preferred method, a ceramic sheet is diced into cubes, and the cubes are plated so that all six faces of each are metallized. Then, two of the end blocks are positioned in a fixture with one of the dielectric chips sandwiched between them. The blocks and chip are aligned in registry so that respective faces of the blocks are in contact with the front and back surfaces of the dielectric chip. Then, with these three components held in place in the fixture, the blocks are fused to the metallic surfaces of the dielectric chip such that the end blocks now serve as the conductive leads to permit the capacitor to be mounted onto metallic traces of a printed circuit. Preferably, a small weight is placed on the upper surfaces of the blocks and chip in the fixture, and then the fixture is place into an oven. The metal on the end blocks can be a conductive material, such as gold, and the fixture is heated through the eutectic temperature of the attaching material to fuse the end blocks to the dielectric chip.

The dielectric chip can be formed by dicing a ceramic dielectric sheet into squares, with the front and back surfaces of the ceramic sheet having been coated with metal, e.g., by sputter coating a metal such as Au—Sn or Ti, W, Ni, and Au.

The above and many other objects, features, and advantages of this invention will become apparent from the ensuing description of selected preferred embodiments, which are to be considered in connection with the accompanying Drawing.

DETAILED DESCRIPTION OF THE PREFERRED EMBODIMENTS

Figure 1:
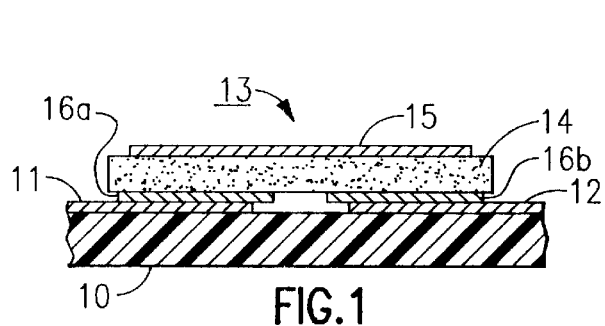
FIG. 1 is a sectional elevational view of a ceramic capacitor according to the prior art.
Figure 2:
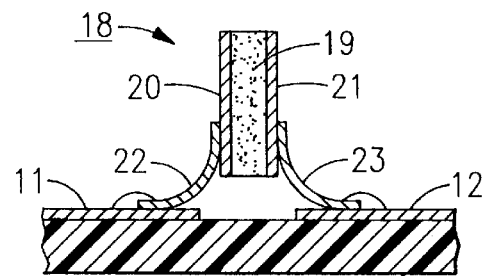
FIG. 2 is a sectional elevational view of another capacitor of the prior art.

With reference to the Drawing, FIGS. 1 and 2 show capacitors of the prior art mounted onto a printed circuit board 10, in which metal traces 11 and 12 constitute a transmission line of a microwave or millimeter wave circuit. In FIG. 1, a flat capacitor 13 is horizontally disposed to bridge the gap between the traces 11, 12. Basically, the capacitor 13 has a dielectric chip or slice 14 that is elongated in the horizontal direction, with a metallized upper surface 15 and metallized lower surface portions 16a and 16b, which are electrically joined to the traces 11 and 12, respectively. The upper metallization can be buried beneath another dielectric layer. This capacitor can produce resonances and thus produce significant insertion losses at frequencies in the microwave and millimeter wave ranges, especially above about 10 GHz.

FIG. 2 shows an example of a standing leaded capacitor 18 installed on the traces 11, 12 of the printed circuit board 10. The capacitor is formed of a vertically oriented ceramic chip 19 with metallized front and back surfaces 20, 21. There are flat metal leads 22, 23 affixed onto the metallized surfaces 20, 21 and these are soldered onto the metal traces 11, 12, respectively. This arrangement has good performance at higher frequencies, but still produces resonances at frequencies above 10 GHz. These resonances are due, in part, to the metal leads 22, 23, which have a finite inductance between the traces and the standing capacitor. Also, the leads 22, 23 are somewhat fragile, and require extreme care in fabrication, shipping, handling, and soldering in place to the traces. Because of this, the capacitors have to be installed manually under a microscope, and robotized or automated circuit fabrication is difficult or impossible to obtain.

Figure 3:
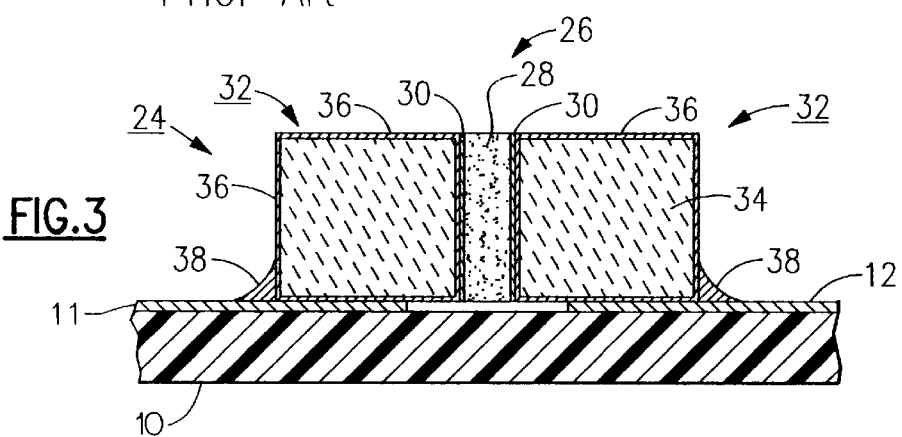
FIG. 3 is a sectional elevation of a standing axial-leaded surface mount capacitor according to an embodiment of this invention.
Figure 4:
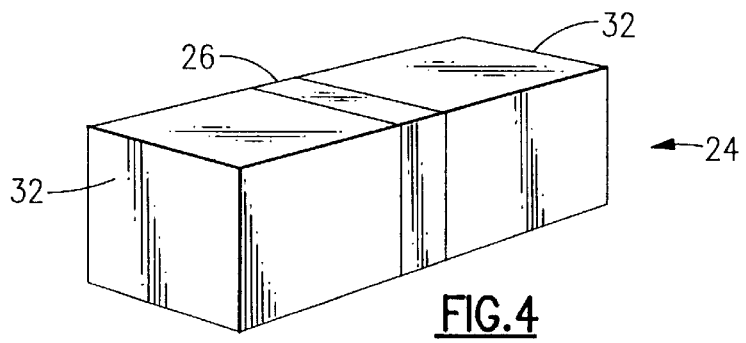
FIG. 4 is a perspective view thereof.
Figure 5:
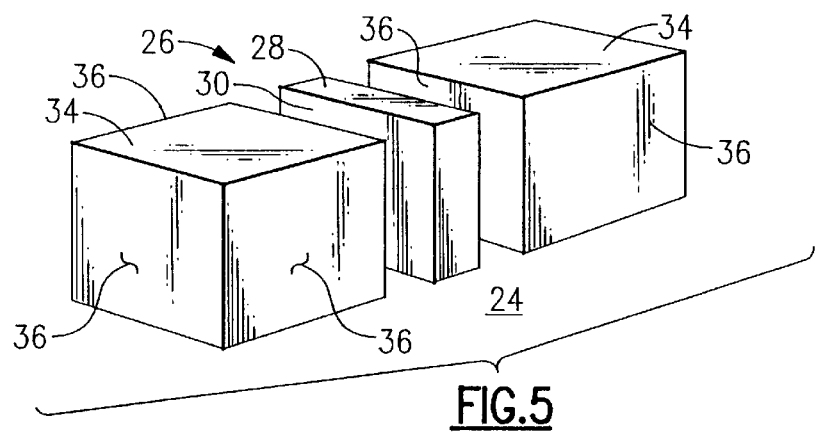
FIG. 5 is an exploded assembly view thereof.

A standing axial-leaded surface mount capacitor 24 according to one embodiment of this invention is shown in a sectional elevation in FIG. 3, and is also shown in a perspective and in an exploded assembly view in FIGS. 4 and 5. A standing or vertical capacitor 26 is formed of a thin dielectric chip or square 28, for example 20 mils to 25 mils on a side, and having a thickness and dielectric constant selected to achieve a desired capacitance. Typically, the capacitance can be selected anywhere between about 0.05 pf and 300 pf, favorably between 5 and 50 pf, but the capacitance is not limited to such range. A typical thickness can be about 6 mils. The front and back surfaces 30, 30 are metallized and not being metallized elsewhere, e.g., with Au—Sn. A pair of end blocks 32 have the same profile as the dielectric chip 28, i.e., square profile of 20 mil sides. In this embodiment, the end blocks are formed of ceramic cubes 34 with a metallic coating 36 on each of the six square sides. In other embodiments, the end blocks can be of metal, such as Kovar, and can be solid or hollow. The material of the end blocks should have the same thermal expansion coefficient as the chip 28, to the extent possible, so as to minimize thermal stresses. However, at the design frequencies (several GHz and above) the electric current is limited by skin effect to the outer surface of the blocks 32. In this embodiment, the cubic end blocks 32 have four-way (i.e., 90°) symmetry about the longitudinal axis of the assembly 24. This makes it possible to pick and place the capacitors mechanically without regard for the orientation, and thus allows the capacitor to be positioned and soldered robotically. The end blocks can be soldered directly to the printed metal traces 11, 12. Soldier connections 38 of the end blocks 32 to the associated traces 11 and 12 are shown in FIG. 3. Also, the capacitor assembly 24 combines the advantages of a flat, surface mount capacitor with the advantages of a standing, axial leaded capacitor, and consequently the capacitor assembly of this embodiment exhibits a flat transmission characteristic in the range of up to 50 GHz, without significant resonances.

The capacitor assembly 24 as shown here can be fabricated without difficulty. The chip capacitor 26 can be fabricated by providing a dielectric sheet with a metallic coating on front and back, e.g., by sputter coating with Au—Sn. Then the sheet can be saw cut or diced into squares or other shapes (e.g., rectangles) of a desired profile, typically about 20 mils by 20 mils, or 25 mils by 25 mils. Persons skilled in this field would understand that intermediate layers are employed to obtain good adhesion to the dielectric substrate. With that regard, a Ti—W adhesion layer can be employed on the ceramic material, and then a solderable barrier of Ni, on top of which the Au—Sn layer is sputtered. The Au—Sn constitutes a eutectic solder. In a preferred embodiment, the Ti—W layer can have a thickness of about 1000 Å, the Ni layer about 50 $\mu$in, and the Au—Sn layer about 300 $\mu$in.

The Au—Sn metallization permits the capacitor assembly to be made without having to use solder preforms. It would also be possible to use a standard metallization system of Ti, W, Ni, or Au on the capacitor 26, and then use solder preforms to attach the end blocks 32.

The ceramic cubes 34 can be formed by dicing a ceramic sheet (e.g., 20 mils thickness) into 20 by 20 by 20 mils cubes. Then the cubes can be surface coated with metal, e.g., by electroless plating with Ni+Au, or another appropriate metal or metals. Preferably, all six sides of each cube 34 are metallized. The ceramic cubes 34 can first be electrolessly coated with a Ni layer, and then a Au layer.

Two of the cubes 34 and the capacitor 26 are placed into a slot or recess in a fixture, with the capacitor 26 sandwiched in between the two cubes 34, and so the three components are in register with one another. The top of the assembly 24 is weighted lightly in the fixture, and then the fixture is heated in a furnace or oven through the eutectic temperature of the metal material, i.e., the gold-tin (or solder preforms if another system is used) to fuse the end blocks to the metal surfaces 30 of the capacitor 26. After this the capacitor assemblies 24 are removed from the fixture, and can be connected in circuit.

As mentioned before, the square cross section along the longitudinal axis permits the part to be installed by an automated pick and place technique, which reduces labor and increases reliability. The flat transmission characteristic reduces insertion losses at all frequencies of interest. With the solid end blocks serving as leads, the blocks are rugged and durable, with a reduced failure rate due to mechanical breakage.

The construction of this invention provides electrical and mechanical stability during assembly and shipping, as well as making assembly simpler and with a reduced scrap rate as compared with wire or ribbon-conductor leaded devices.

The invention is not restricted to end blocks and chips of square or rectangular profile, and could in some instances have a triangular, hexagonal, or other geometric shape.

While the invention has been described hereinabove with reference to certain preferred embodiments, it should be recognized that the invention is not limited to those precise embodiments. Rather, many modification and variations would present themselves to persons skilled in the art without departing from the scope and spirit of this invention, as defined in the appended claims.

We claim:

1. Standing axial-leaded surface mount capacitor comprising
   a dielectric chip having a rectangular profile and having metallized front and back surfaces but not being metallized elsewhere; and
   first and second blocks which have rectangular profiles to match the profile of said dielectric chip and which are conductive at least on outer surfaces thereof;

said first and second blocks being affixed respectively onto the front and back metallized surfaces of said chip to serve as conductive leads for mounting directly onto metallic circuit traces.

2. The standing axial-leaded surface mount capacitor according to claim 1 wherein the profile of said blocks and said chip has a width of 20 to 25 mils.

3. The standing axial-leaded surface mount capacitor according to claim 1, having a value between 0.05 and 300 pf.

4. The standing axial-leaded surface mount capacitor according to claim 1, having a value between 5 and 50 pf.

5. The standing axial-leaded surface mount capacitor according to claim 1 wherein said first and second end blocks are metal cubes.

6. The standing axial-leaded surface mount capacitor according to claim 5 wherein each said metal cube has a coefficient of thermal expansion matching the coefficient of thermal expansion of said dielectric chip.

7. The standing axial-leaded surface mount capacitor according to claim 1 wherein the front and back surfaces of said dielectric chip are coated with a barrier metal and a eutectic solderable metal.

8. Standing axial-leaded surface mount capacitor comprising a dielectric chip having a rectangular profile and having metallized front and back surfaces; and first and second blocks which have profiles to match the profile of said dielectric chip and which are conductive at least on outer surfaces thereof;

said first and second blocks being affixed respectively onto the front and back metallized surfaces of said chip to serve as conductive leads for mounting onto metallic circuit traces;

wherein said first and second blocks each comprise a ceramic cube having metal plated onto the outer surfaces thereof.

9. The standing axial-leaded surface mount capacitor according to claim 8 wherein said ceramic cubes are plated with Ni—Au.

10. The standing axial-leaded surface mount capacitor according to claim 8 wherein said dielectric chip has a square profile of the same dimension as said ceramic cubes.

* * * * *